(12) United States Patent
Pak et al.

(10) Patent No.: US 7,628,574 B2
(45) Date of Patent: Dec. 8, 2009

(54) APPARATUS AND METHOD FOR PROCESSING SUBSTRATES USING ONE OR MORE VACUUM TRANSFER CHAMBER UNITS

(75) Inventors: Samuel S. Pak, San Ramon, CA (US); Christopher C. Chang, Brentwood, CA (US)

(73) Assignee: Arcus Technology, Inc., Livermore, CA (US)

( * ) Notice: Subject to any disclaimer, the term of this patent is extended or adjusted under 35 U.S.C. 154(b) by 16 days.

(21) Appl. No.: 11/692,850

(22) Filed: Mar. 28, 2007

(65) Prior Publication Data

US 2007/0231109 A1 Oct. 4, 2007

Related U.S. Application Data

(60) Provisional application No. 60/787,079, filed on Mar. 28, 2006.

(51) Int. Cl.
*H01L 21/44* (2006.01)
(52) U.S. Cl. .................................................... 414/217
(58) Field of Classification Search .................. 414/217, 414/935
See application file for complete search history.

(56) References Cited

U.S. PATENT DOCUMENTS

| 6,235,634 | B1* | 5/2001 | White et al. ................. 438/680 |
| 6,514,032 | B1* | 2/2003 | Saino et al. .............. 414/744.1 |
| 6,540,466 | B2 | 4/2003 | Bachrach |
| 6,734,950 | B2* | 5/2004 | Nakano ........................ 355/72 |
| 6,758,647 | B2 | 7/2004 | Kaji et al. |
| 6,832,863 | B2* | 12/2004 | Sugimoto et al. ........... 396/611 |
| 2001/0014224 | A1 | 8/2001 | Hasebe et al. |
| 2003/0012575 | A1 | 1/2003 | Ueda et al. |
| 2004/0115032 | A1 | 6/2004 | Ostermann et al. |
| 2005/0105991 | A1 | 5/2005 | Hofmeister et al. |

OTHER PUBLICATIONS

International Search Report and Written Opinion of the International Searching Authority for PCT application No. PCT/US07/65405, filed on Mar. 28, 2007.

\* cited by examiner

*Primary Examiner*—Charles A Fox
(74) *Attorney, Agent, or Firm*—Wilson & Ham; Thomas H. Ham

(57) ABSTRACT

An apparatus and method for processing substrates uses one or more vacuum transfer chamber units to transfer some of the substrates between at least one load lock chamber unit and at least one vacuum process chamber unit.

11 Claims, 10 Drawing Sheets

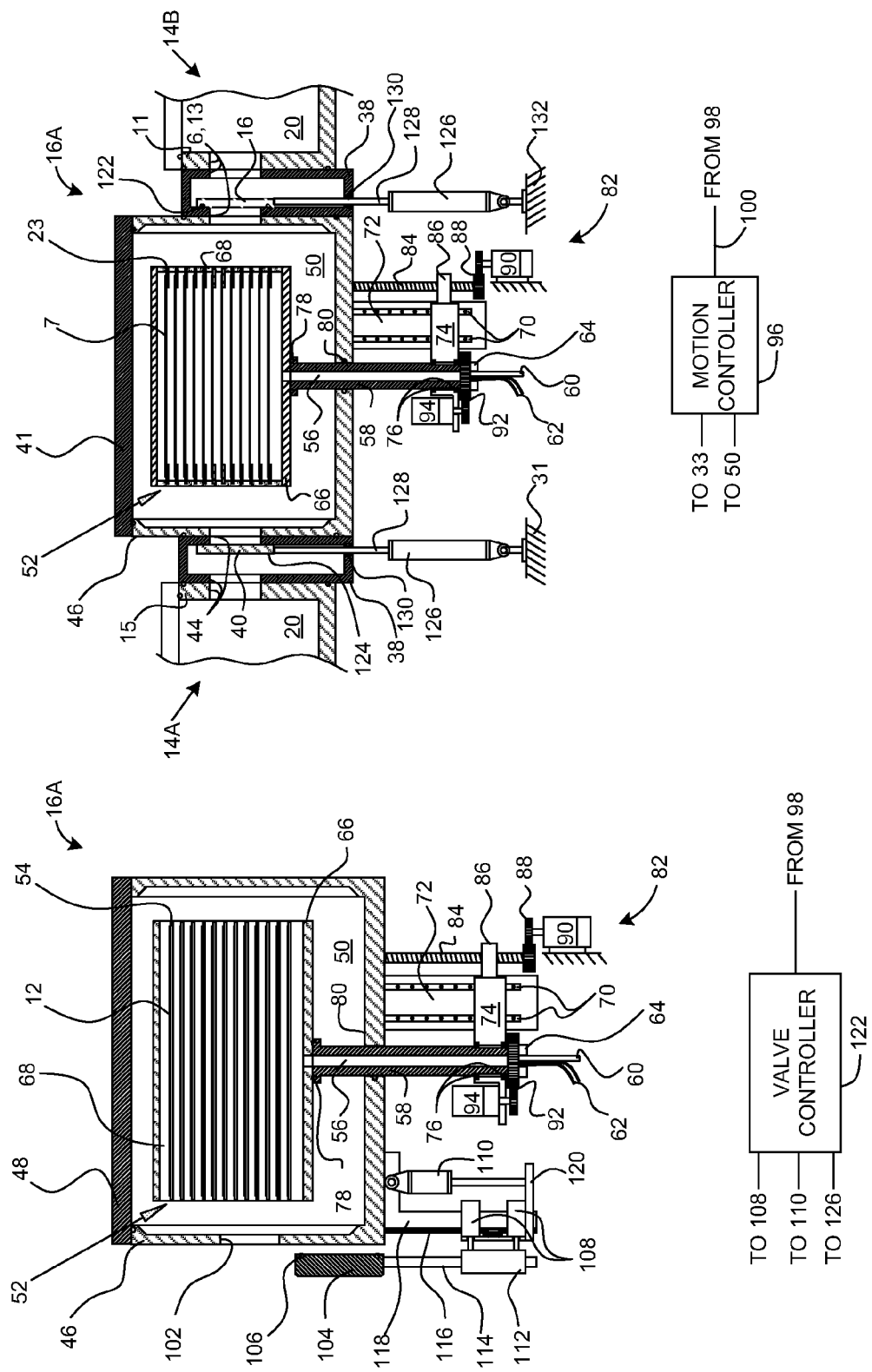

APPARATUS AND METHOD FOR PROCESSING SUBSTRATES USING ONE OR MORE VACUUM TRANSFER CHAMBER UNITS

CROSS REFERENCE TO RELATED APPLICATION

This application is entitled to the benefit of U.S. Provisional Patent Application Ser. No. 60/787,079 filed on Mar. 28, 2006, which is incorporated herein by reference.

BACKGROUND OF THE INVENTION

Fabrication of semiconductor integrated circuits and flat panel displays involves numerous processes, such as etching, chemical vapor deposition, sputtering and cleaning, which are performed on semiconductor and flat panel display substrates. Each of these processes may be performed using a different single processing tool, i.e., a tool that performs a single fabrication process. Since multiple fabrication processes must be performed, the substrates must be transferred from one processing tool to the next, which exposes the substrates to potential contamination. In addition, transferring substrates between different processing tools increases the overall processing time.

Consequently, multiple processing tools have been developed that can perform multiple fabrication processes. A multiple processing tool, which is typically known in the semiconductor and FPD industry as a "cluster tool", includes multiple process chamber units arranged in a circular pattern connected to a single vacuum transfer chamber with one vacuum transfer robot to transfer substrates between the multiple process chamber units and single or dual load lock chambers. Since substrates are transferred within a single tool for different fabrication processes, the potential for contamination is reduced. In addition, the substrates can be more quickly transferred between process chamber units, which reduces the overall processing time.

A concern with conventional multiple processing tools is that system performance and reliability are greatly reduced by potential failure of the single vacuum transfer robot located inside the vacuum transfer chamber. Although fabrication processes can be continued by the vacuum process chamber units, the failure of the vacuum transfer robot limits the transferring of the substrates thereby causing system downtime. However, there are also conventional tools in which the transfer robots are located in an atmospheric environment while the process chamber units perform fabrication processes in a vacuum environment. Thus, in these multiple processing conventional tools, a vacuum environment must be created repeatedly in some of these process chamber units when substrates are transferred into and out of the process chamber units. This increases complexity and manufacturing cost of these multiple processing tools, as well as the overall processing time.

Thus, there is a need for an apparatus and method for processing substrates that reduces the complexity and manufacturing cost of the apparatus, as well as the overall processing time, while increasing system reliability and up-time.

SUMMARY OF THE INVENTION

An apparatus and method for processing substrates use one or more vacuum transfer chamber units to transfer some of the substrates between at least one load lock chamber unit and at least one vacuum process chamber unit. The vacuum transfer chamber units allow the substrates to be transferred between different load lock and vacuum process chamber units of the apparatus in a vacuum environment, which reduces the complexity and manufacturing cost of the apparatus, as well as the overall processing time. Furthermore, the design of the apparatus allows for multi-step, sequential and/or parallel processing of the substrates, while maintaining parallel substrates transfer capability, which adds increased system productivity, reliability and expandability merits for overall reduction in cost of ownership to end users.

An apparatus for processing substrates in accordance with an embodiment of the invention comprises a vacuum transfer chamber unit having a side, at least one load lock chamber unit connected to the side of the vacuum transfer chamber unit, at least one vacuum process chamber unit connected to the side of the vacuum transfer chamber unit, and a linear robotic transfer mechanism located within the vacuum transfer chamber unit to transfer some of the substrates between the at least one load lock chamber unit and the at least one vacuum process chamber unit through the vacuum transfer chamber unit.

An apparatus for processing substrates in accordance with another embodiment of the invention comprises a first vacuum transfer chamber unit, a second vacuum transfer chamber unit, at least one load lock chamber unit connected to the first and second vacuum transfer chamber units such that the at least one load lock chamber unit is positioned between the first and second vacuum transfer chamber units, at least one vacuum process chamber unit connected to the first and second vacuum transfer chamber units such that the at least one vacuum process chamber unit is positioned between the first and second vacuum transfer chamber units, a first robotic transfer mechanism located within the first vacuum transfer chamber unit to transfer some of the substrates between the at least one load lock chamber unit and the at least one vacuum process chamber unit through the first vacuum transfer chamber unit, and a second robotic transfer mechanism located within the second vacuum transfer chamber unit to transfer some of the substrates between the at least one load lock chamber unit and the at least one vacuum process chamber unit through the second vacuum transfer chamber unit.

A method for processing substrates in accordance with an embodiment of the invention comprises loading some of the substrates into at least one load lock chamber unit, the at least one load lock chamber unit being connected to a side of a vacuum transfer chamber unit, linearly transferring some of the substrates from the at least one load lock chamber unit to at least one vacuum process chamber unit through the vacuum transfer chamber unit, the at least one vacuum process chamber unit being connected to the side of the vacuum transfer chamber unit, performing at least one fabrication process on some of the substrates within the at least one vacuum process chamber unit, and linearly transferring some of the substrates from the at least one vacuum process chamber unit to the at least load lock chamber unit through the vacuum transfer chamber unit.

A method for processing substrates in accordance with another embodiment of the invention comprises loading some of the substrates into at least one load lock chamber unit, the at least one load lock chamber unit being connected to first and second vacuum transfer chamber units such that the at least one load lock chamber unit is positioned between the first and second vacuum transfer chamber units, transferring some of the substrates from the at least one load lock chamber unit to at least one vacuum process chamber unit through one of the first and second vacuum transfer chamber units, the at least one vacuum process chamber unit being connected to the first and second vacuum transfer chamber units such that the at least one vacuum process chamber unit is positioned between the first and second vacuum transfer chamber units, performing at least one fabrication process on some of the substrates within the at least one vacuum process chamber unit, and transferring some of the substrates from the at least one vacuum process chamber unit to the at least one load lock chamber unit through one of the first and second vacuum transfer chamber units.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 3 is an enlarged view of the cross-sectional view of FIG. 2 with respect to a load lock chamber unit of the apparatus of FIG. 1.

FIG. 4 is a vertical cross-sectional view, partly schematic, of the load lock chamber unit taken along line 4-4 in FIG. 1.

DETAILED DESCRIPTION

Figure 1:
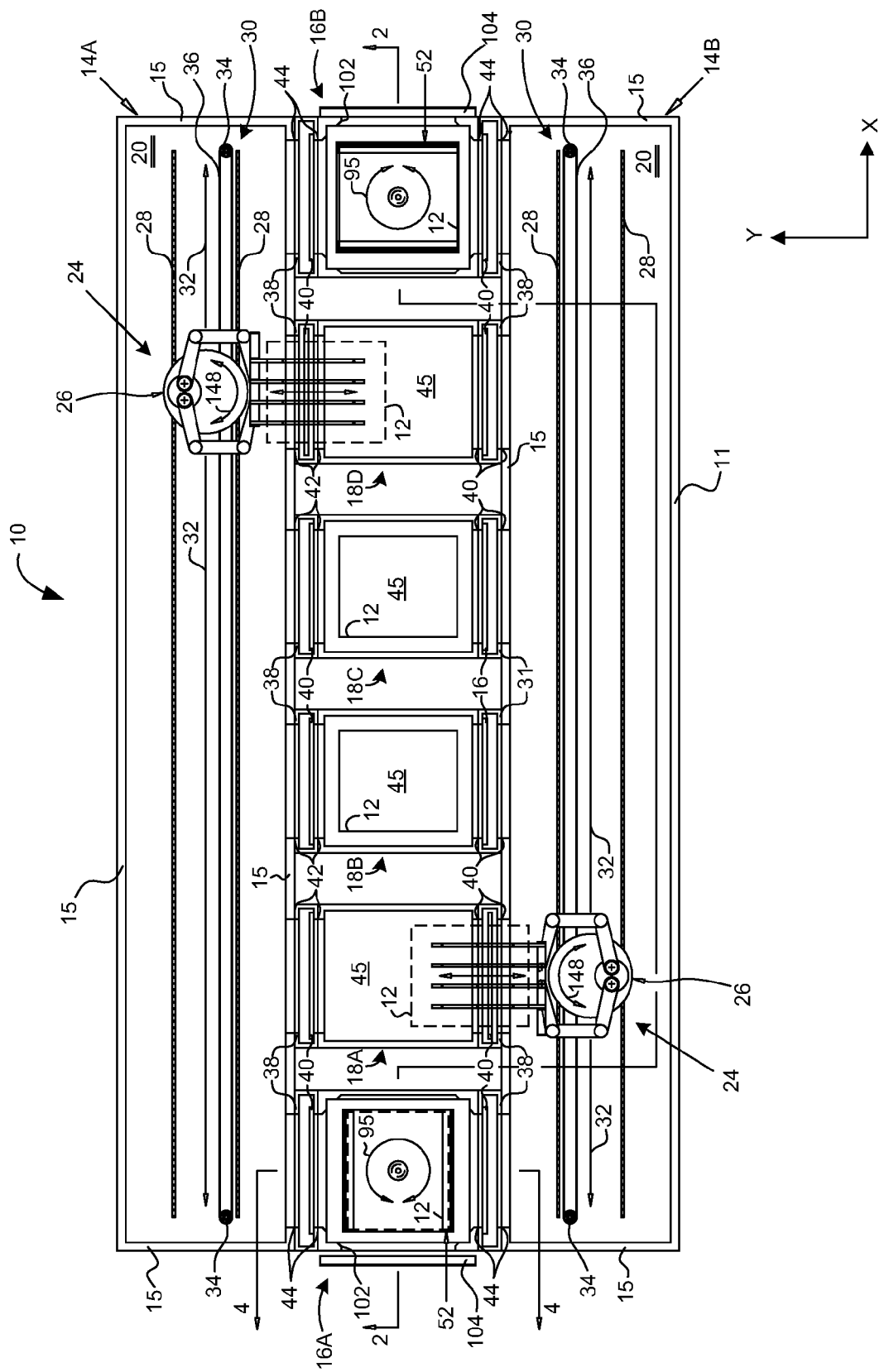
FIG. 1 is a simplified plan view, partly schematic, of an apparatus in accordance with an embodiment of the invention.
Figure 2:
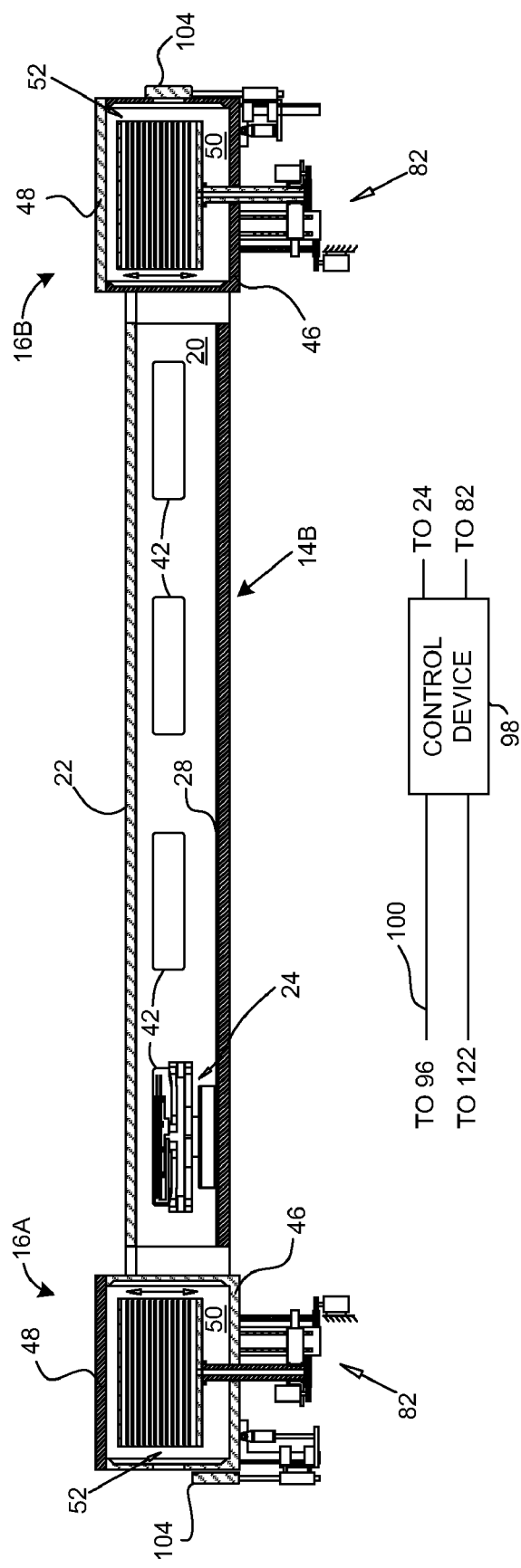
FIG. 2 is a vertical cross-sectional view, partly schematic, of the apparatus 10 of FIG. 1 taken along line 2-2 in FIG. 1.

With reference to FIG. 1, an apparatus 10 for processing substrates 12, such as semiconductor and flat panel display substrates, in accordance with an embodiment of the invention is described. FIG. 1 is a top plan view of the apparatus 10, which is shown with top lids removed. FIG. 2 is a vertical cross-sectional view, partly schematic, of the apparatus 10 along line 2-2 in FIG. 1. The apparatus 10 is an integrated modular multiple chamber vacuum processing system. The apparatus 10 includes one or more vacuum transfer chamber units 14A and 14B, one or more load lock chamber units 16A and 16B, and one or more vacuum process chamber units 18A, 18B, 18C and 18D. Each of the vacuum process chamber units 18A, 18B, 18C and 18D is configured to perform a specific semiconductor integrated circuit (IC) or flat panel display (FPD) fabrication process, such as gas chemistry high density plasma etching, plasma enhanced gas chemistry deposition, atomic layer deposition, physical vapor deposition, physical sputtering, in-situ process monitoring, photolithography, gas chemistry dry cleaning, integrated dry and wet cleaning, wet chemical processing and other types of required processes for fabrication of semiconductor IC and FPD products. Thus, the apparatus 10 is uniquely adapted for enabling various types of semiconductor IC and FPD fabrication processes by attaching different vacuum process chamber units to the apparatus. As described in more detail below, the load lock chamber units 14A and 14B and the vacuum process chamber units 18A, 18B, 18C and 18D are directly connected to the vacuum transfer chamber units 14A and 14B so that the substrates 12 can be transferred between any of the load lock chamber units and the vacuum process chamber units 16A and 16B via the vacuum transfer chamber units in a vacuum environment. Thus, a vacuum environment in the vacuum process chamber units 18A, 18B, 18C and 18D need not be repeatedly created when the substrates 12 are transferred into and out of the vacuum process chamber units, which reduces complexity and manufacturing cost of the apparatus 10, as well as the overall processing time. Furthermore, the design of the apparatus 10 allows for multi-step, sequential and/or parallel, processing of the substrates 12, while maintaining parallel substrates transfer capability, which adds increased system productivity, reliability and expandability merits for overall reduction in cost of ownership to end users.

As shown in FIG. 1, the apparatus 10 in this embodiment includes two vacuum transfer chamber units 14A and 14B, two load lock chamber units 16A and 16B, and four vacuum process chamber units 18A, 18B, 18C and 18D. However, in other embodiments, the apparatus 10 may include any number of vacuum transfer chamber units, load lock chamber units and vacuum process chamber units. The vacuum transfer chamber units 14A and 14B are shown in FIG. 1 as being generally rectangular in shape. However, in other embodiments, the vacuum transfer chamber units 14A and 14B may be shaped in a different configuration. In the illustrated embodiment, each of the vacuum transfer chamber units 14A and 14B has four sidewalls 15 that define an enclosed vacuum transfer chamber or enclosure 20, which is covered by a transfer chamber lid 22 (shown in FIG. 2). Each of the vacuum transfer chamber units 14A and 14B includes a substrate transfer system 24, which is positioned within the chamber 20 of the respective vacuum transfer chamber unit. In the illustrated embodiment, the substrate transfer system 24 is a linear substrate transfer system configured to linearly move one or more substrates 12 along the length of the vacuum transfer chamber unit 14A or 14B in the X axis direction to transfer the substrates into and/or out of the load lock chamber units 16A and 16B and the vacuum process chamber units 18A, 18B, 18C and 18D, as described in more detail below. The substrate transfer system 24 includes a robotic transfer mechanism 26 mounted on linear guides 28. The substrate transfer system 24 further includes a linear drive system 30 to linearly move the robotic transfer mechanism 26 on the linear guides 28 along the X axis direction, as indicated by arrows 32. Thus, the robotic transfer mechanism 26 is a linear robotic transfer mechanism, which can move in a linear direction. In the illustrated embodiment, the linear drive system 30 includes pulleys 34 and one or more belts 36 to linearly displace the robotic transfer mechanism 26 along the linear guides 28. However, in other embodiments, the linear drive system 30 may employ other conventional mechanisms to linearly displace the robotic transfer mechanism 26. The robotic transfer mechanism 26 is described in more detail below with reference to FIGS. 5 and 6.

The load lock chamber units 16A and 16B are connected to the vacuum transfer chamber units 14A and 14B such that each of the load lock chamber units is positioned between the vacuum transfer chamber units. The vacuum process chamber units 18A, 18B, 18C and 18D are also connected to the vacuum transfer chamber units 14A and 14B such that each of the vacuum process chamber units is positioned between the vacuum transfer chamber units. Each of the load lock chamber units 16A and 16B and the vacuum process chamber units 18A, 18B, 18C and 18D is connected to the vacuum transfer chamber units 14A and 14B via two controllable slit valves 38, which are attached or mounted to opposite sides of the respective chamber unit that face the vacuum transfer chamber units 14A and 14B. Each of the slit valves 38 is also attached or mounted to a side of one of the vacuum transfer chamber units 14A and 14B that faces the load lock chamber units 16A and 16B and the vacuum process chamber units 18A, 18B, 18C and 18D. Thus, the slit valves 38 are attached at interfaces between the vacuum chamber units 14A and 14B, the load lock chamber units 16A and 16B and the vacuum process chamber units 18A, 18B, 18C and 18D. Each of the slit valves 38 includes a slit door 40, which can be opened or closed. The vacuum process chamber units 18A, 18B, 18C and 18D and the vacuum transfer chamber units 14A and 14B have common slit openings 42 at the slit valves 38 connecting the vacuum process chamber units and the vacuum transfer chamber units so that the substrates 12 can pass through the slit openings with the slit doors 40 of these slit valves opened during loading and unloading of the substrates into and out of the vacuum process chamber units using the robotic transfer mechanisms 26. Similarly, the load lock chamber units 16A and 16B and the vacuum transfer chamber units 14A and 14B have common gate slit openings 44 at the slit valves 38 connecting the load lock chamber units and the vacuum transfer chamber units so that the substrates 12 can pass through the gate slit openings with the slit doors 40 of these slit valves opened during loading and unloading of the substrates into and out of the load lock chamber units using the robotic transfer mechanisms 26. The internal environments between the vacuum transfer chamber units 14A and 14B and the load lock chamber units 16A and 16B and between the vacuum transfer chamber units and the vacuum process chamber units 18A, 18B, 18C and 18D are selectively opened or closed via controlling of the slit doors 40 of the slit valves 38, which separate the vacuum transfer chamber units from the load lock and vacuum process chamber units. Since the vacuum transfer chamber units 14A and 14B are mounted to opposing ends or sides of each of the load lock chamber units 16A and 16B and the vacuum process chamber units 18A, 18B, 18C and 18D, the handling of substrates can occur in parallel or simultaneously to reduce the tact-time required for transferring of substrates between the load lock and vacuum process chamber units.

Each of the vacuum process chamber units 18A, 18B, 18C and 18D is structurally configured to define an enclosed vacuum processing chamber or enclosure 45. The structural configuration of the vacuum process chamber units 18A, 18B, 18C and 18D is similar to that of the load lock chamber units 16A and 16B, which are described in detail below. Each of the vacuum process chamber units 18A, 18B, 18C and 18D is adapted or configured to perform one or more processes on one or more substrates positioned within that vacuum process chamber unit for fabrication of semiconductor IC and FPD products, such as gas chemistry high density plasma etching, plasma enhanced gas chemistry deposition, atomic layer deposition, physical vapor deposition, physical sputtering, in-situ process monitoring, photolithography, gas chemistry dry cleaning, integrated dry and wet cleaning, wet chemical processing. As an example, one of the vacuum process chamber units 18A, 18B, 18C and 18D may be configured for plasma enhanced chemical vapor deposition, which is described below with reference to FIG. 7.

The load lock chamber units 16A and 16B in accordance with an embodiment of the invention are described with reference to FIGS. 2, 3 and 4. FIG. 3 is an enlarged view of the load lock chamber unit 16A from the cross-sectional view of FIG. 2. FIG. 4 is a vertical cross-sectional view, partly schematic, of the load lock chamber unit 16A along line 4-4 in FIG. 1. The load lock chamber units 16A and 16B are used to transfer the substrates 12 between an atmospheric environment outside of the apparatus 10 and vacuum environments of the vacuum transfer chamber units 14A and 14B and the vacuum process chamber units 18A, 18B, 18C and 18D.

As illustrated in FIGS. 2, 3 and 4, each of the load lock chamber unit 16A and 16B includes a chamber wall structure 46, which defines the sidewalls and the bottom wall of the respective load lock chamber unit, and a load lock chamber unit lid 48, which is used to cover the chamber wall structure. The chamber wall structure 46 and the load lock chamber unit lid 48 define an interior chamber or enclosure 50 of the respective load lock chamber unit. Each of the load lock chamber unit 16A and 16B includes an internal storage elevator assembly 52 that holds a number of substrates 12, for example, up to twelve (12) substrates, on horizontal support plates 54 of the assembly. The elevator assembly 52 can be configured for heating, cooling and combination thereof through an opening 56 inside a main elevator shaft 58 to accommodate one or more heating or cooling tubes or channels 60 and/or one or more electrical wires 62 via vacuum feed-through adapter 64 for prerequisites and/or post-requisites of process requirements. As an example, plasma enhanced chemical vapor deposition process requires preheating of substrates to elevated temperatures above 200 degrees Celsius, e.g., between 300-450 degrees Celsius, prior to processing of substrates, and requires post-cooling of substrates after the process has been completed to temperatures approximately below 60 degrees Celsius. One or more of the channels 60 may be used to carry heating (hot) and/or cooling (cold) water to meet prerequisites and/or post-requisites of process requirements. One or more of the electrical wires 62 may be used as resistive heating elements to meet prerequisites and post-requisites of process requirements. In operation, the elevator assembly 52 indexes the substrates 12 vertically to present the substrates at a vertical position for loading and unloading by either an external atmospheric transfer robot (not shown) for atmospheric substrate exchange or at a vertical position for loading and unloading by one of the robotic transfer mechanisms 26 in the vacuum transfer chamber units 14A and 14B for vacuum substrate exchange.

In the illustrated embodiment, the internal storage elevator assembly 52 includes a base plate 66 and a slotted vertical front plate 68 to which the horizontal wafer support plates 54 are mounted. The elevator assembly 52 also includes a pair of linear guides 70, which are fixed on a main support guide plate 72 that supports a main elevator shaft mounting block 74 onto which the main elevator shaft 58 is mounted via a set of bearings 76. The main elevator shaft 58 is also mounted to the base plate 66 via a vacuum seal 78 and extends through the bottom wall of the chamber wall structure 46 via a vacuum seal 80 to guide and move the elevator assembly 52. The elevator assembly 52 can be raised and lowered by a vertical indexing system 82, which includes a ball screw 84 and a nut 86 that are actuated through a gear set 88 driven by a vertical drive motor 90. The ball screw 82 and the nut 84 are used to displace the main elevator shaft mounting block 74, which is mounted to the main elevator shaft 58. The main elevator shaft 58 is also actuated through a gear set 92 driven by a rotational drive motor 94 to rotate the elevator assembly 52 to rotate the substrates 12 within the load lock chamber unit 16A, as indicated by arrows 95 in FIG. 1. The rotation of the substrates 12 within the load lock chamber unit 16A allows the substrates to be transferred between the elevator assembly 52 and the vacuum transfer chamber units 16A and 16B using the robotic transfer mechanisms 26. The operation of the vertical drive motor 90 and the rotational drive motor 94 are controlled by a motion controller 96 (shown in FIG. 4), which may be an internal component of a control device 98 (shown in FIG. 2) or a stand-alone motion controller that is connected to the control device 98 via a communication line 100, such as an Ethernet or Serial line. As an example, the control device 98 of the apparatus 10 may be a computer or a programmable logic controller.

As best illustrated in FIG. 3, each of the load lock chamber units 16A and 16B has an access opening 102 to load and unload the substrates 12 into and out of the respective load lock chamber unit. A conventional atmospheric substrate handling robot (not shown) may be used for loading and unloading the substrates 12 between one or more substrate cassettes (not shown) and one of the load lock chamber units 16A and 16B. Each of the load lock chamber units 16A and 16B includes a gate door 104, which is similar or identical to the slit doors 40 of the slit valves 38. As shown in FIG. 2, the gate door 104 is provided with seals 106 attached on the sealing surface of the gate door to hermetically seal the access opening 102 when the gate door is closed. The gate door 104 can be opened or closed electronically using air cylinders 108 and 110. The air cylinders 108 are attached a connector 112, which supports a shaft 114 attached to the gate door 104. The air cylinders 108 are fixed to a linear guide 116, a support plate 118, and an actuation plate 120. The air cylinder 110 is also fixed to the support plate 118. The moving rod end of the air cylinder 110 is attached to the actuation plate 120. In operation, the air cylinder 110 vertically moves the actuation plate 120 to vertically move the gate door 104. When the gate door 104 is placed in front of the access opening 102, the air cylinders 108 move the gate door toward the access opening to close the gate door or moves the gate door away from the access opening to open the gate door. The air cylinders 108 and 110 are controlled by a valve controller 122 (shown in FIG. 3), which includes electrically controllable valves (not shown) to control the air cylinders 108 and 110. The value controller 122 is connected to and controlled by the control device 98, which sends control signals to the valve controller to control the air cylinders 108 and 110.

As best illustrated in FIG. 4, each of the load lock chamber units 16A and 16B are connected to the vacuum transfer chamber units 14A and 14B via two slit valves 38, which are attached to opposite sides of the respective load lock chamber unit that face the vacuum transfer chamber units 14A and 14B. Each slit door 40 of the slit valves 38 is provided with seals 124 attached on the sealing surface of the slit door to hermetically seal the respective gate slit opening 44 when the slit door is closed. Each slit door 40 can be opened or closed electronically using a separate air cylinder 126, which is attached to a shaft 128 connected to the respective slit door 40. The shaft 128 extends through the respective slit valve 38 via a vacuum seal 130. The air cylinder 126 is fixed to a support structure 132, which may be part of a structural frame of the apparatus 10. Similar to the air cylinders 108 and 110, the air cylinders 126 are controlled by the valve controller 122 to open and close the respective slit doors 40 by vertically moving the shafts 128 connected to the slit doors.

Figure 5:
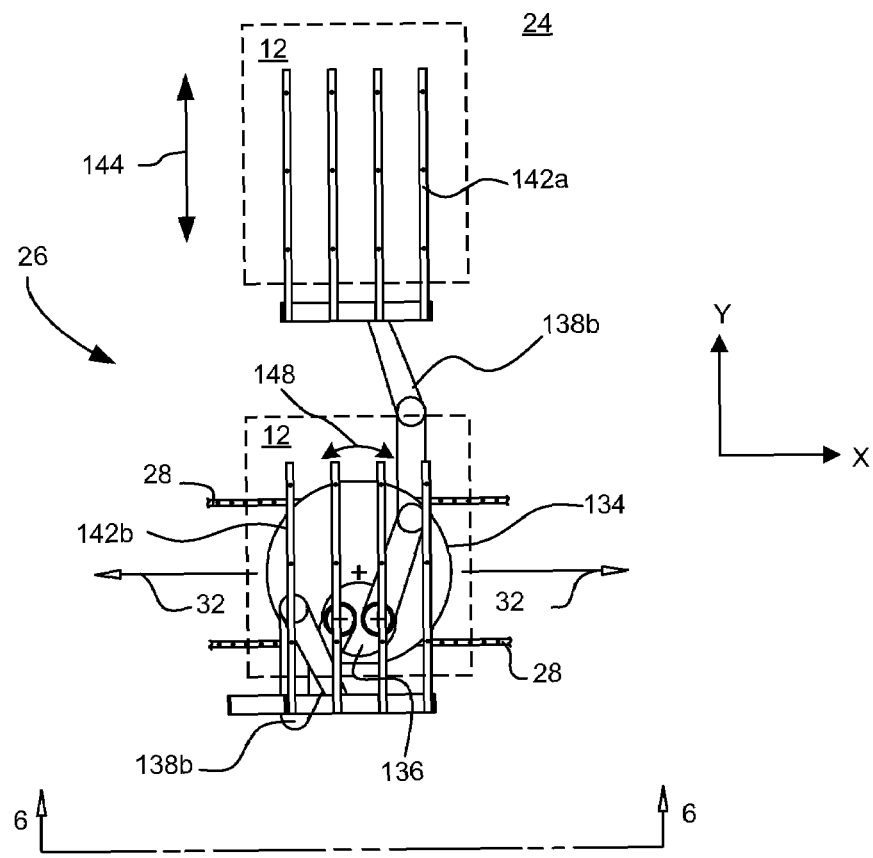
FIG. 5 is an enlarged, top plan view of a robotic transfer mechanism included in the apparatus in accordance with an embodiment of the invention.
Figure 6:
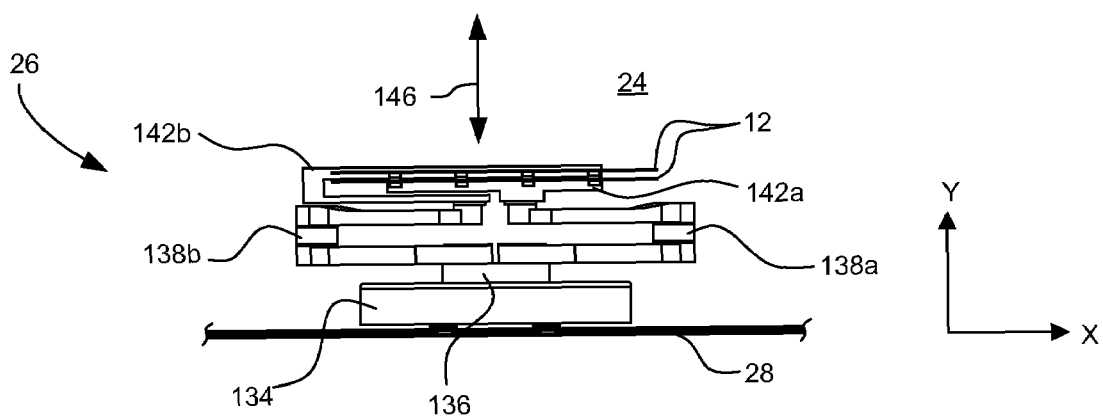
FIG. 6 is a rear view of the robotic transfer mechanism taken along line 6-6 in FIG. 5.

Referring now to FIGS. 1, 5 and 6, the substrate transfer system 24 in accordance with an embodiment of the invention is described. The substrate transfer system 24 is mounted internal to each of the vacuum transfer chamber units 14A and 14B for transferring the substrates 12 between the elevator assemblies 52 of the load lock chamber units 16A and 16B and the vacuum transfer chamber units, between the vacuum transfer chamber units and the individual vacuum process chamber units 18A, 18B, 18C and 18D, and between the vacuum process chamber units.

As described above, the substrate transfer system 24 includes the robotic transfer mechanism 26 on the linear guides 28. As shown in FIG. 5, the robotic transfer mechanism 26 includes a concentric base plate 134, a concentric vertical shaft 136 and dual, three arm link mechanisms 138a and 138b. The three arm link mechanisms 138a and 138b are mounted on the concentric vertical shaft 136, which is attached to the concentric base plate 134. The concentric base plate 134 is positioned on the linear guides 28 so that the robotic transfer mechanism 26 can be linearly moved along the X axis direction, as indicated by arrows 32. The three arm link mechanisms 138a and 138b include robot blades 142a and 142b, respectively, which are each configured to hold a single substrate 12. The three arm link mechanisms 138a and 138b are configured for Y-Axis motion movement (straight line extension and retraction) of each of the robot blades 142a and 142b, as illustrate by an arrow 144. The concentric vertical shaft 136 is configured to raise and lower the three arm link mechanisms 142a and 142b to provide Z axis motion movement (straight line up and down) of the three arm link mechanisms, as indicated by an arrow 146 in FIG. 6. The concentric base plate 134 is configured to rotate the three arm link mechanisms 142a and 142b, as indicated by an arrow 148 in FIG. 5.

Figure 7:
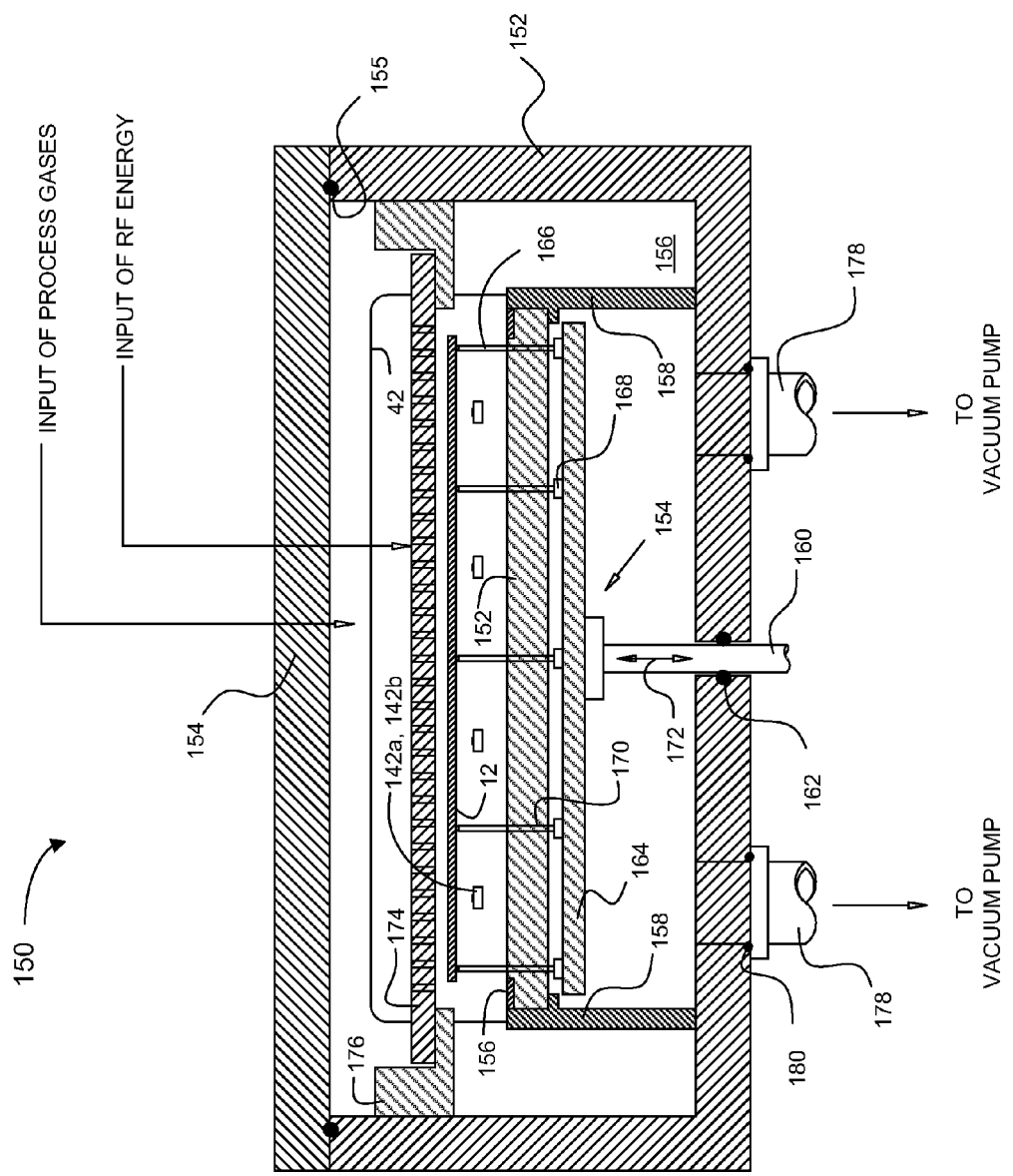
FIG. 7 is a simplified, partially schematized, cross-sectional view of a vacuum process chamber unit configured for a plasma enhanced chemical vapor deposition process in accordance with an embodiment of the invention.

Referring to FIG. 7, a vacuum process chamber unit 150 configured for plasma enhanced chemical vapor deposition is provided as an example of the type of vacuum process chamber units that can be included in the apparatus 10. The vacuum process chamber unit 150 includes a chamber wall structure 152, which defines the sidewalls and the bottom wall of the vacuum process chamber unit 150, and a process chamber unit lid 154, which is used to cover the chamber wall structure 152 via a vacuum seal 155. The chamber wall structure 152 and the process chamber unit lid 154 define an interior chamber or enclosure 156 of the vacuum process chamber unit 150. This structural configuration of the vacuum process chamber unit 150 may be common to all the vacuum process chamber units 18A, 18B, 18C and 18D.

The vacuum process chamber unit 150 further includes a heated process platen 152 (also termed "heated chuck") and a lift pin mechanism 154, which may also be found in most of the vacuum process chamber units 18A, 18B, 18C and 18D. The process platen 152 is covered by electrically insulating but thermally conducting material 156, such as alumina ceramic, all around the outside perimeter of the top surface of the process platen. The process platen 152 is fixed to thermally insulating support brackets 158. The lift pin mechanism 154 includes a shaft 160 that extends through the bottom wall of the vacuum process chamber unit 150 via a vacuum seal 162. The shaft 160 is attached to a horizontal support plate 164 onto which lift pins 166 are fixed using mounting blocks 168. The lift pins 166 extend and retract vertically through the pin openings 170 on the process platen 152 when the shaft 160 is moved vertically, as indicated by an arrow 172, to displace a substrate 12 from the process platen 152 or the robot blades 142a or 142b of the respective robotic transfer mechanism 26 for loading and unloading of the substrate. The substrates 12 can pass through the openings 42 on both ends or sides of the vacuum process chamber unit 150 during the loading and unloading sequence of the substrates via the robot blades 142a or 142b of the robotic transfer mechanisms 26.

The vacuum process chamber unit 150 also includes gas distribution showerheads 174 to apply process gases, which are supplied from an external source (not shown). The gas distribution showerheads 174 are electrically powered, for example, by radio frequency (RF) energy and are mounted horizontally above the process platen 152 via electrically insulating mounting hardware 176 attached to the interior sidewall surface of the chamber wall structure 152. Vacuum plumbings 178 are fixed to the chamber wall structure 152 of the vacuum process chamber unit 150 via a vacuum seal 180 to provide capability to change the pressure of the internal chamber 156 of the vacuum process chamber unit 150.

An overall operation of the apparatus 10 in accordance with an embodiment of the invention is now described with reference to FIG. 1. Initially, the substrates 12 are loaded into one or both of the load lock chamber units 16A and 16B. One or more of the substrates 12 are then transferred from one or both of the load lock chamber units 16A and 16B to one or more of the vacuum process chamber units 18A, 18B, 18C and 18D using one or both of the robotic transfer mechanisms 26 in the vacuum transfer chamber units 14A and 14B. If the robotic transfer mechanism 26 in the vacuum transfer chamber unit 14A is used, some of the substrates 12 are transferred to one or more of the vacuum process chamber units 18A, 18B, 18C and 18D through the vacuum transfer chamber unit 14A. If the robotic transfer mechanism 26 in the vacuum transfer chamber unit 14B is used, some of the substrates 12 are transferred to one or more of the vacuum process chamber units 18A, 18B, 18C and 18D through the vacuum transfer chamber unit 14B. The transferred substrates 12 are then processed at the respective vacuum process chamber units 18A, 18B, 18C and/or 18D. After the substrates 12 are processed, the substrates are transferred to other vacuum process chamber units 18A, 18B, 18C and/or 18D or to one or both of the load lock chamber units 16A and 16B using one or both of the robotic transfer mechanisms 26 in the vacuum transfer chamber units 14A and 14B. In some embodiments, the robotic transfer mechanism 26 in the vacuum transfer chamber unit 14A is used to transfer the substrates 12 from one or both of the load lock chamber units 14A and 14B to one or more of the vacuum process chamber units 18A, 18B, 18C and 18D, while the robotic transfer mechanism 26 in the vacuum transfer chamber unit 14B is used to transfer the substrates from one or more of the vacuum process chamber units 18A, 18B, 18C and 18D to one or both of the load lock chamber units 16A and 16B. Since each of the robotic transfer mechanisms 26 in the vacuum transfer chamber units 14A and 14B can access any of the load lock chamber units 16A and 16B and any of the vacuum process chamber units 18A, 18B, 18C and 18D, each of the robotic transfer mechanisms 26 can be used to transfer the substrates 12 between any of the load lock and vacuum process chamber units.

Figure 8:
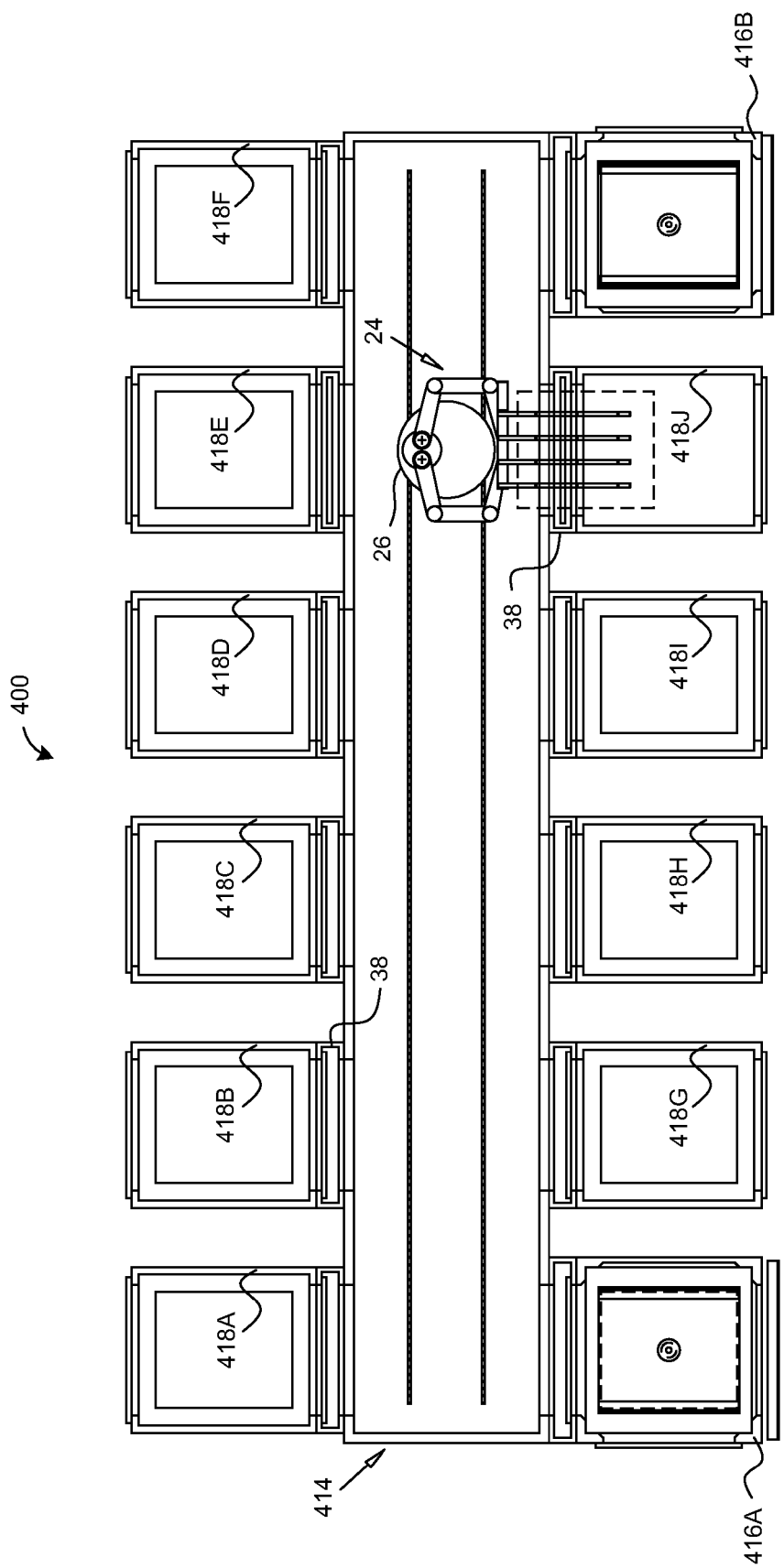
FIG. 8 is a top plan view, partially schematized, of an apparatus in accordance with an alternative embodiment of the invention.

Referring to FIG. 8, an apparatus 400 in accordance with an alternative embodiment of the invention is shown. The apparatus 400 includes a single vacuum transfer chamber unit 414, two load lock chamber units 416A and 416B, and ten vacuum process chamber units 418A-418J. However, in other embodiments, the apparatus 400 may include any number of vacuum transfer chamber units, any number of load lock chamber units and any number of vacuum process chamber units.

In the illustrated embodiment, the load lock chamber units 416A and 416B are connected to one side of the vacuum transfer chamber unit 414. The vacuum process chamber units 418G-418J are connected to the same side of the vacuum transfer chamber unit 414 as the load lock chamber units 416A and 416B. The vacuum process chamber units 418A-418F are connected to the opposite side of the vacuum transfer chamber unit 414. Thus, the vacuum transfer unit 414 is positioned between the vacuum process chamber units 418A-418F and the load lock and vacuum process chamber units 416A, 416B and 418G-418J. The load lock chamber units 416A and 416B and the vacuum process chamber units 418A-418J are connected to the vacuum transfer chamber unit 414 via slit valves 38. Thus, the slit valves 38 are attached to the vacuum transfer chamber unit 414, the load lock chamber units 416A and 416B and the vacuum process chamber units 418A-418I at the interfaces of these units.

The vacuum transfer unit 414 is similar to the vacuum transfer units 14A and 14B of FIG. 1. Thus, the vacuum transfer unit 414 includes a substrate transfer system 24 with a robotic transfer mechanism 26. However, since the load lock and vacuum process chamber units 416A, 416B and 418A-418J are connected to opposite sides of the vacuum transfer unit 414, the vacuum transfer unit 414 includes slit openings on both of the opposite side where the vacuum transfer unit 44 is attached to the slit valves 38.

The load lock chamber units 416A and 418B are also similar to the load lock chamber units 16A and 16B of FIG. 1. However, since each of the load lock chamber units 416A and 418B is attached to only a single vacuum transfer chamber unit, each of the load lock chamber units 416A and 418B includes only a single gate slit opening where that load lock chamber unit is attached to one of the slit valves 38.

The vacuum process chamber units 418A-418J are also similar to the vacuum process chamber units 18A-18D of FIG. 1. However, since each of the vacuum process chamber units 418A-418J is attached to only a single vacuum transfer chamber unit, each of the vacuum process chamber units 418A-418J includes only a single slit opening where that vacuum process chamber unit is attached to one of the slit valves 38.

Since the load lock and vacuum process chamber units 416A, 416B and 418A-418J are all connected to the vacuum transfer unit 414 via the slit valves 38, the robotic transfer mechanism 26 in the vacuum transfer chamber unit 414 has access to all the load lock and vacuum process chamber units and can transfer substrates between any of these units through the vacuum transfer chamber unit 414.

Figure 9:
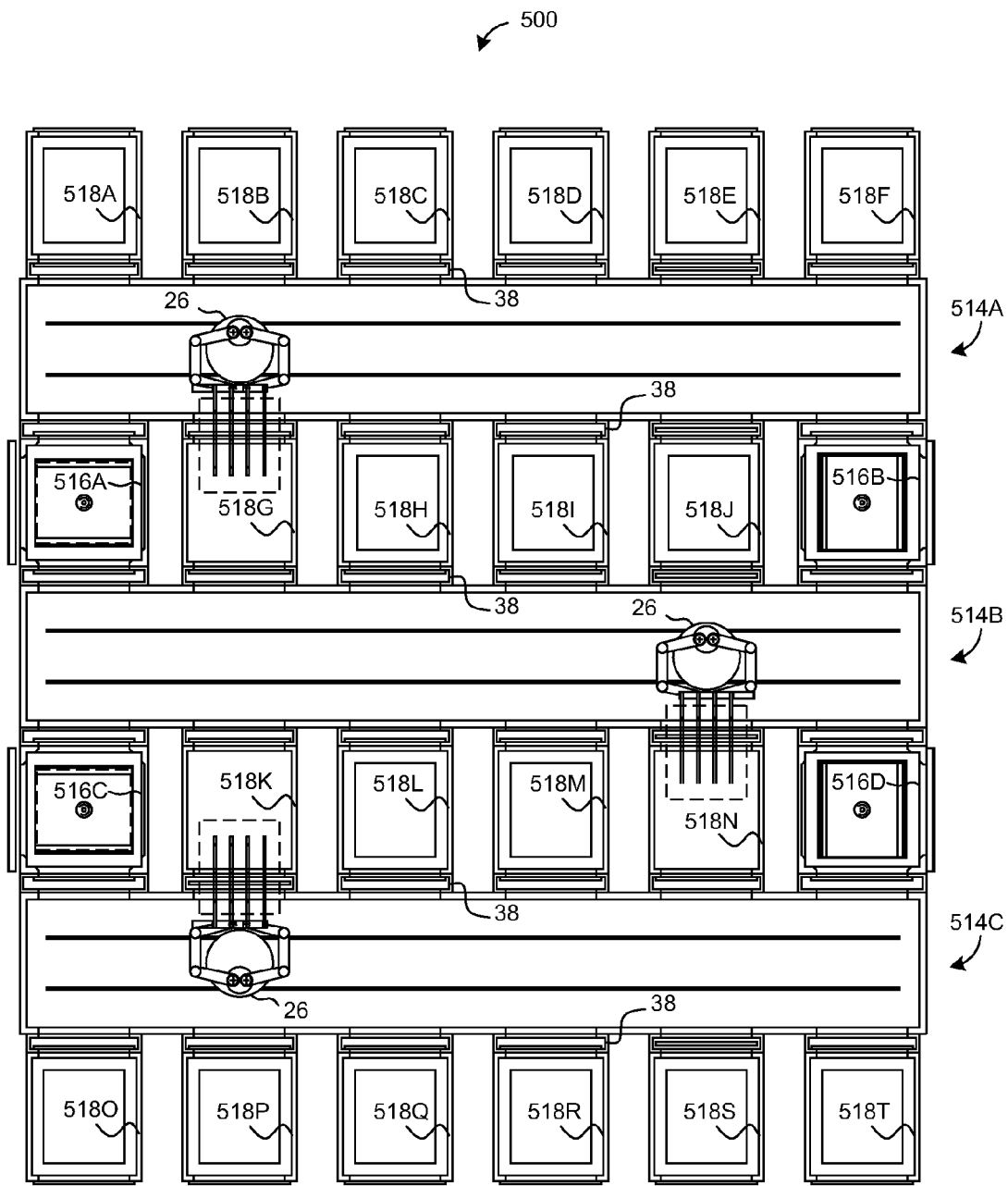
FIG. 9 is a top plan view, partially schematized, of an apparatus in accordance with another alternative embodiment of the invention.

Referring to FIG. 9, an apparatus 500 in accordance with another alternative embodiment of the invention is shown. The apparatus 500 includes three vacuum transfer chamber units 514A, 514B and 514C, four load lock chamber units 516A-516D, and twenty vacuum process chamber units 518A-518T. However, in other embodiments, the apparatus 500 may include any number of vacuum transfer chamber units, any number of load lock chamber units and any number of vacuum process chamber units.

The vacuum transfer units 514A-514C are similar to the vacuum transfer unit 414 of FIG. 8. The load lock chamber units 516A-516D are similar to the load lock chamber units 16A and 16B of FIG. 1. The vacuum process chamber units 518A-518F and 5180-518T are similar to the vacuum process chamber units 418A-418F of FIG. 8. The vacuum process chamber units 518G-518N are similar to the vacuum process chamber units 18A-18D of FIG. 1.

The vacuum process chamber units 518A-518F are connected to one side of the vacuum transfer chamber unit 514A, while the load lock chamber units 516A and 516B and the vacuum process chamber units 518G-518J are connected to the opposite side of the vacuum transfer chamber unit 514A. Thus, the robotic transfer mechanism 26 in the vacuum transfer chamber unit 514A has access to the load lock chamber units 516A and 516B and the vacuum process chamber units 518A-514J and can transfer substrates between any of these units through the vacuum transfer chamber unit 514A.

The load lock chamber units 516A and 516B and the vacuum process chamber units 518G-518J are also connected to one side of the vacuum transfer chamber unit 514B, while the load lock chamber units 516C and 516D and the vacuum process chamber units 518K-518N are connected to the opposite side of the vacuum transfer chamber unit 514B. Thus, the robotic transfer mechanism 26 in the vacuum transfer chamber unit 514B has access to the load lock chamber units 514A-514D and the vacuum process chamber units 518G-514N and can transfer substrates between any of these units through the vacuum transfer chamber unit 514B.

The load lock chamber units 516C and 516D and the vacuum process chamber units 518K-518N are also connected to one side of the vacuum transfer chamber unit 514C, while the vacuum process chamber units 5180-518T are connected to the opposite side of the vacuum transfer chamber unit 514C. Thus, the robotic transfer mechanism 26 in the vacuum transfer chamber unit 514C has access to the load lock chamber units 514C and 514D and the vacuum process chamber units 518K-514T and can transfer substrates between any of these units through the vacuum transfer chamber unit 514C.

The load lock chamber units 516A-516D and the vacuum process chamber units 518A-518T are connected to their respective vacuum transfer units 514A-514C via slit valves 38 at interfaces between these units.

The apparatus 500 can be expanded by attaching one or more additional vacuum transfer chamber unit and attaching one or more load lock chamber units and/or one or more vacuum process chamber units.

Figure 10:
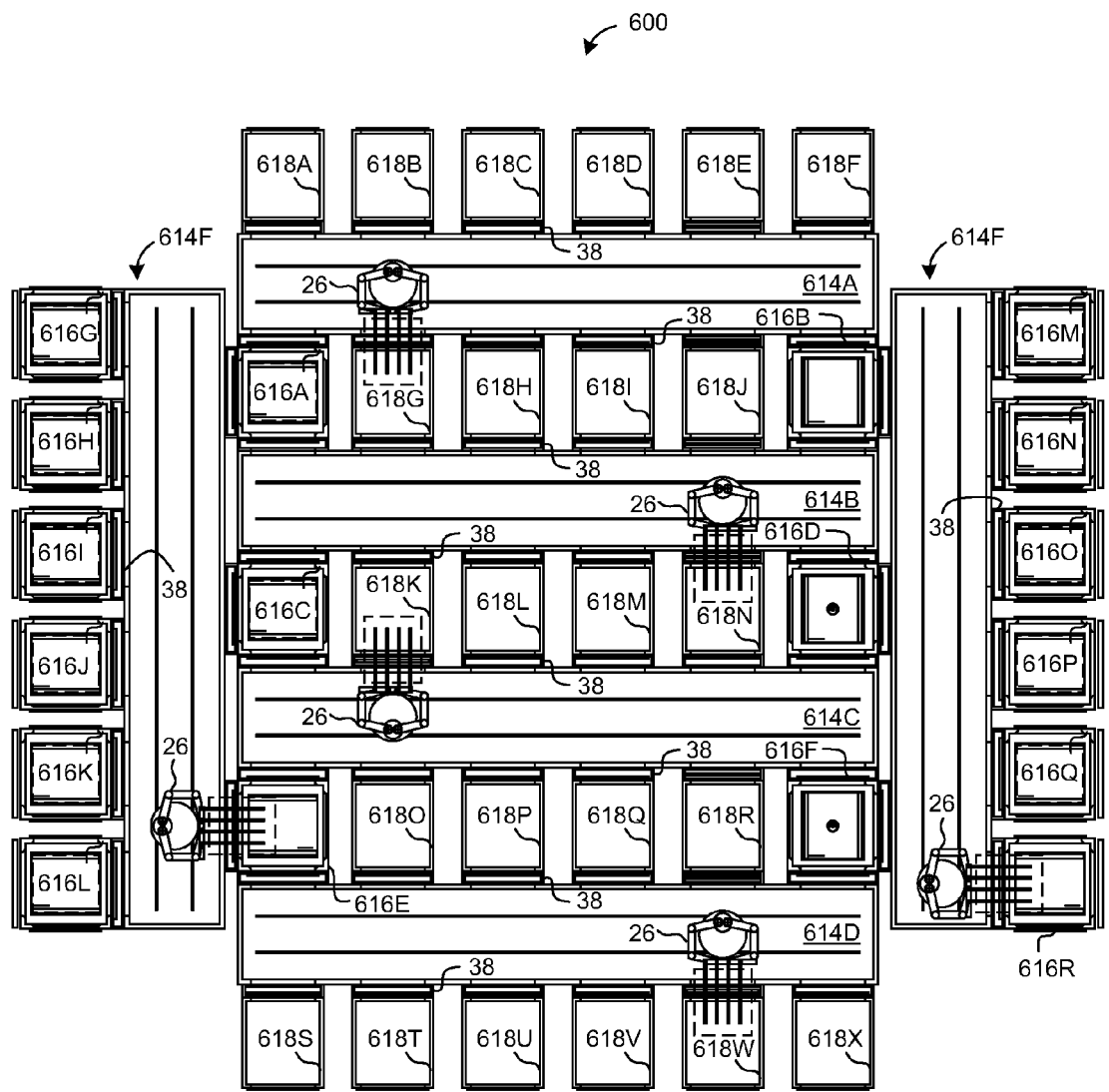
FIG. 10 is a top plan view, partially schematized, of an apparatus in accordance with another alternative embodiment of the invention.

Referring to FIG. 10, an apparatus 600 in accordance with another alternative embodiment of the invention is shown. The apparatus 600 includes six vacuum transfer chamber units 614A-614F, eighteen load lock chamber units 616A-616D, and twenty-four vacuum process chamber units 918A-918T. However, in other embodiments, the apparatus 600 may include any number of vacuum transfer chamber units, any number of load lock chamber units and any number of vacuum process chamber units.

The vacuum transfer chamber units 614A-614D, the load lock chamber units 616A-616F and the vacuum process chamber units 618A-618X of the apparatus 600 are connected in a similar configuration as the apparatus 500 of FIG. 8. The load lock chamber units 616A-616F and the vacuum process chamber units 618A-618X are connected to their respective vacuum transfer units 614A-614D via slit valves 38 at interfaces between these units. In the apparatus 600, the load lock chamber units 616A-616F and the vacuum process chamber units 618A-618X are connected to their respective vacuum transfer chamber units 614A-614D such that each of the robotic transfer mechanism 26 in the vacuum transfer chamber units 614A-614D has access to the load lock chamber units and/or the vacuum process chamber units connected to the respective vacuum transfer chamber unit and can transfer substrates between any of these units through that vacuum transfer chamber unit.

In contrast to the apparatus 500, the apparatus 600 further includes the vacuum transfer chamber units 614E and 614F and the load lock chamber units 616G-616R. The vacuum transfer chamber units 614E and 614F are orientated such that the lengths of these vacuum transfer chamber units are approximately orthogonal with respect to the lengths of the vacuum transfer chamber units 614A-614D. The vacuum transfer chamber unit 614E is connected to the load lock chamber units 616A, 616C and 616E. The load lock chamber units 616G-616L are connected to the vacuum transfer chamber unit 614E such that the vacuum transfer chamber unit 614E is positioned between the load lock chamber units 616G-616L and the load lock chamber units 616A, 616C and 616E. Consequently, the load lock chamber units 616G-616L and the load lock chamber units 616A, 616C and 616E are connected to opposite sides of the vacuum transfer chamber unit 614E. Thus, the robotic transfer mechanism 26 in the vacuum transfer chamber unit 614E has access to the load lock chamber units 616A, 616C, 616E and 616G-616L and can transfer substrates between any of these units through the vacuum transfer chamber unit 614E.

Similarly, the vacuum transfer chamber unit 614F is connected to the load lock chamber units 616B, 616D and 616F. The load lock chamber units 616M-616R are connected to the vacuum transfer chamber unit 614F such that the vacuum transfer chamber unit 614F is positioned between the load lock chamber units 616M-616R and the load lock chamber units 616B, 616D and 616F. Consequently, the load lock chamber units 616M-616R and the load lock chamber units 616B, 616D and 616F are connected to opposite sides of the vacuum transfer chamber unit 614F. Thus, the robotic transfer mechanism 26 in the vacuum transfer chamber unit 614F has access to the load lock chamber units 616B, 616D, 616F and 616M-616R and can transfer substrates between any of these units through the vacuum transfer chamber unit 614F.

The load lock chamber units 616A-616R and the vacuum process chamber units 618A-618X are connected to their respective vacuum transfer units 614A-614F via slit valves 38 at interfaces between these units.

The apparatus 600 can be expanded by attaching one or more additional vacuum transfer chamber unit and attaching one or more load lock chamber units and/or one or more vacuum process chamber units.

Figure 11:
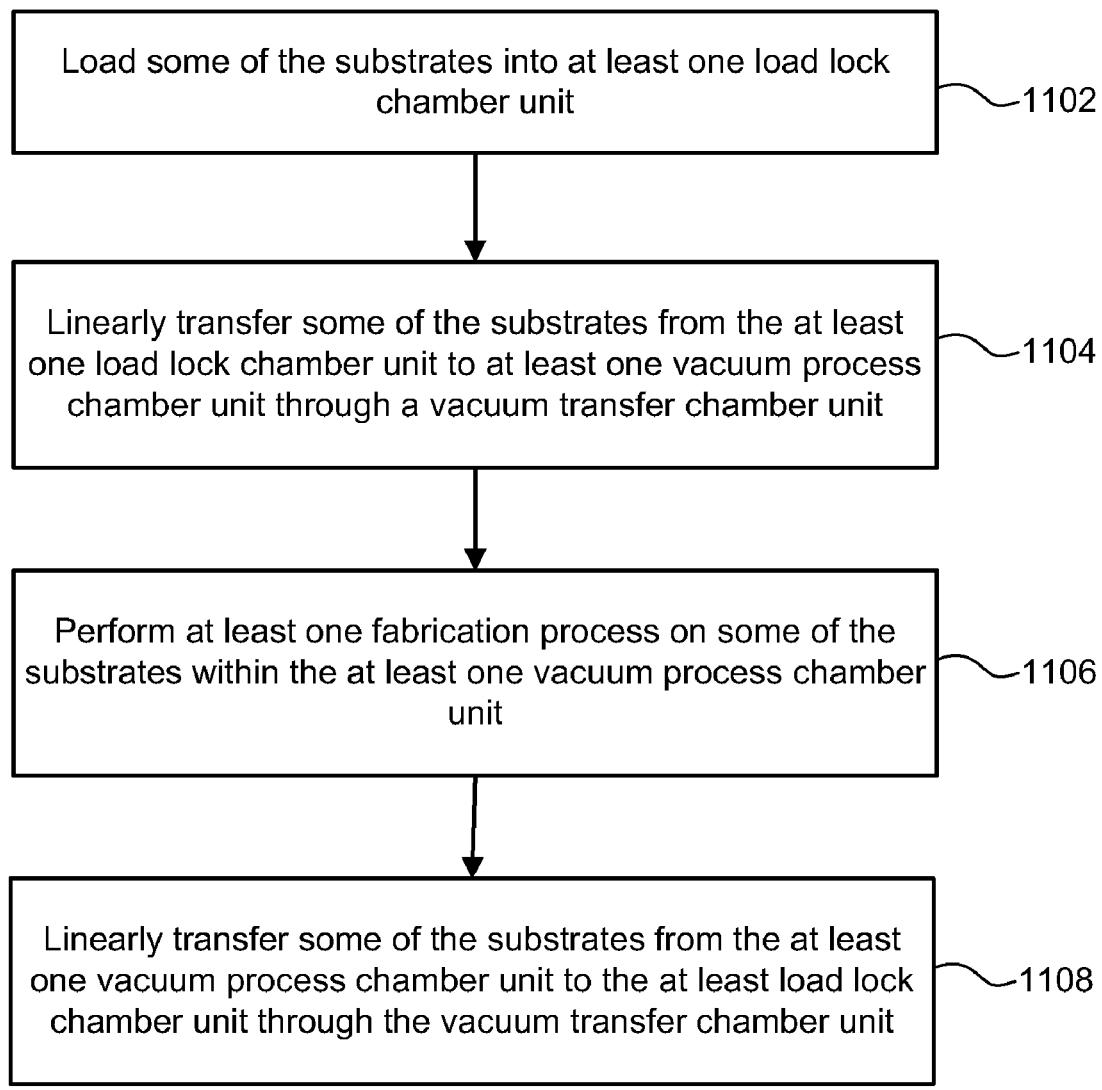
FIG. 11 is a process flow diagram of a method for processing substrates in accordance with an embodiment of the invention.

A method for processing substrates in accordance with an embodiment of the invention is described with reference to a flow diagram of FIG. 11. At block 1102, some of the substrates are loaded into at least one load lock chamber unit. The at least one load lock chamber unit is connected to a side of a vacuum transfer chamber unit. Next, at block 1104, some of the substrates are linearly transferred from the at least one load lock chamber unit to at least one vacuum process chamber unit through the vacuum transfer chamber unit. The at least one vacuum process chamber is connected to the same side of the vacuum transfer chamber unit as the at least one load lock chamber unit. Next, at block 1106, at least one fabrication process is performed on some of the substrates within the at least one vacuum process chamber unit. Next, at block 1108, some of the substrates are linearly transferred from the at least one vacuum process chamber unit to the at least load lock chamber unit through the vacuum transfer chamber unit.

Figure 12:
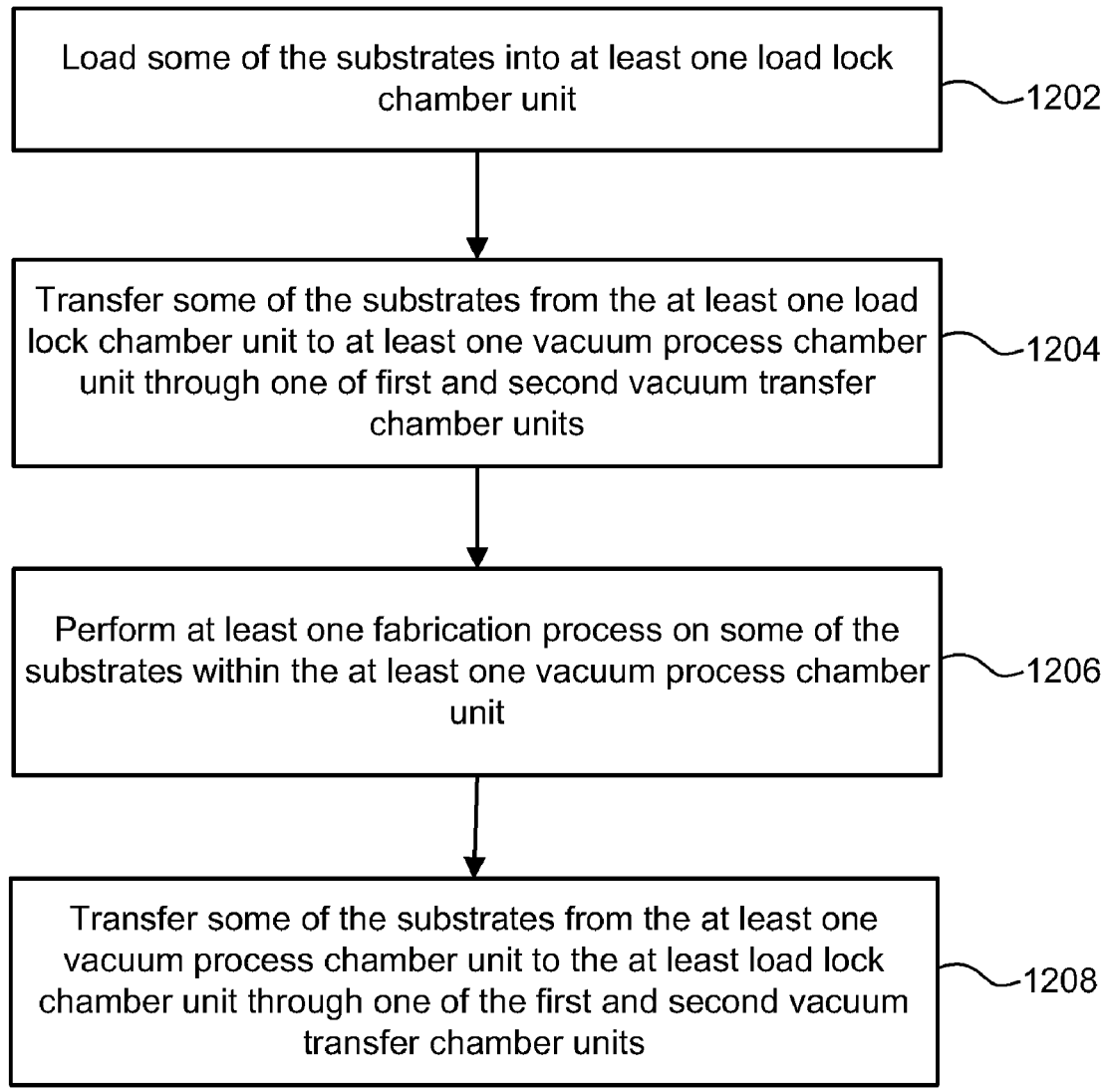
FIG. 12 is a process flow diagram of a method for processing substrates in accordance with another embodiment of the invention.

A method for processing substrates in accordance with another embodiment of the invention is described with reference to a flow diagram of FIG. 12. At block 1202, some of the substrates are loaded into at least one load lock chamber unit. The at least one load lock chamber unit is connected to first and second vacuum transfer chamber units such that the at least one load lock chamber unit is positioned between the first and second vacuum transfer chamber units. Next, at block 1204, some of the substrates are transferred from the at least one load lock chamber unit to at least one vacuum process chamber unit through one of the first and second vacuum transfer chamber units. The at least one vacuum process chamber unit is connected to the first and second vacuum transfer chamber units such that the at least one vacuum process chamber unit is positioned between the first and second vacuum transfer chamber units. Next, at block 1206, at least one fabrication process is performed on some of the substrates within the at least one vacuum process chamber unit. Next, at block 1208, some of the substrates are transferred from the at least one vacuum process chamber unit to the at least one load lock chamber unit through one of the first and second vacuum transfer chamber units.

Although specific embodiments of the invention have been described and illustrated, the invention is not to be limited to the specific forms or arrangements of parts so described and illustrated. As an example, in some embodiments, some or all of the load lock chamber units may be stacked such that one load lock chamber unit is positioned directly above another load lock chamber unit with both stacked units being connected to the same vacuum transfer chamber unit. These stacked load lock chamber units may be used in any of the apparatus described herein. The scope of the invention is to be defined by the claims appended hereto and their equivalents.

What is claimed is:

1. An apparatus for processing substrates, said apparatus comprising:
    a vacuum transfer chamber unit having a side;
    at least one load lock chamber unit connected to said side of said vacuum transfer chamber unit;
    at least one vacuum process chamber unit connected to said side of said vacuum transfer chamber unit;
    a linear robotic transfer mechanism located within said vacuum transfer chamber unit to transfer some of said substrates between said at least one load lock chamber unit and said at least one vacuum process chamber unit through said vacuum transfer chamber unit;
    a second vacuum transfer unit connected to said at least one load lock chamber unit and said at least one vacuum process chamber unit such that said at least one load lock chamber unit and said at least one vacuum process chamber unit are positioned between said vacuum transfer chamber unit and said second vacuum transfer unit;
    a second linear robotic transfer mechanism located within said second vacuum transfer chamber unit to transfer some of said substrates between said at least one load lock chamber unit and said at least one vacuum process chamber unit through said second vacuum transfer chamber unit;
    at least one additional vacuum process chamber unit connected to said vacuum transfer chamber unit such that said vacuum transfer chamber unit is positioned between said at least one vacuum process chamber unit and said at least one additional vacuum process chamber unit;
    a third vacuum transfer chamber unit connected to said at least one additional vacuum process chamber unit such that said at least one additional vacuum process chamber unit is positioned between said second vacuum transfer chamber unit and said third vacuum transfer chamber unit;
    a third linear robotic transfer mechanism located within said third vacuum transfer chamber unit to access said at least one additional vacuum process chamber unit;
    a fourth vacuum transfer chamber unit connected to said at least one load lock chamber unit;
    at least one additional load lock chamber unit connected to said fourth vacuum transfer chamber unit such that said fourth vacuum transfer chamber unit is positioned between said at least one load lock chamber unit and said at least one additional load lock chamber unit; and
    a fourth linear robotic transfer mechanism located within said fourth vacuum transfer chamber unit to transfer some of said substrates between said at least one load lock chamber unit and said at least one additional load lock chamber unit through said fourth transfer chamber unit.

2. The apparatus of claim 1 wherein said at least one load lock chamber unit includes two load lock chamber units connected to said vacuum transfer unit such that said linear robotic transfer mechanism located within said vacuum transfer chamber unit is able to access one or both of said two load lock chamber units.

3. The apparatus of claim 1 further comprising a plurality of slit valves attached to said vacuum transfer chamber unit, said at least one load lock chamber unit and said at least one vacuum process chamber unit at interfaces between said vacuum transfer chamber unit, said at least one load lock chamber unit and said at least one vacuum process chamber unit.

4. The apparatus of claim 1 wherein said at least one load lock chamber unit includes an elevator assembly to hold some of said substrates, said elevator assembly being configured to raise, lower and rotate said substrates held by said elevator assembly.

5. The apparatus of claim 1 wherein each of said at least one vacuum process chamber unit is configured to perform a process selected from a group consisting of gas chemistry high density plasma etching, plasma enhanced gas chemistry deposition, atomic layer deposition, physical vapor deposition, physical sputtering, in-situ process monitoring, photolithography, gas chemistry dry cleaning, integrated dry and wet cleaning and wet chemical processing.

6. The apparatus of claim 1 wherein said linear robotic transfer mechanism includes at least one three link arm and at least one blade to hold one or more of said substrates.

7. The apparatus of claim 1 further comprising at least one additional process chamber unit connected to a second side of said vacuum transfer chamber unit such that said linear robotic transfer mechanism is able to access said at least one additional process chamber, said second side being an opposite side of said side of said vacuum transfer chamber unit.

8. The apparatus of claim 1 further comprising a plurality of slit valves attached to said vacuum transfer chamber unit, said second vacuum transfer chamber unit, said at least one load lock chamber unit and said at least one vacuum process chamber unit at interfaces between said vacuum transfer chamber unit, said second vacuum transfer chamber unit, said at least one load lock chamber unit and said at least one vacuum process chamber unit, each of said at least one load lock chamber unit and each of said at least one vacuum process chamber unit being attached to two of said slit valves.

9. An apparatus for processing substrates, said apparatus comprising:
    a first vacuum transfer chamber unit;
    a second vacuum transfer chamber unit;
    at least one load lock chamber unit connected to said first and second vacuum transfer chamber units such that said at least one load lock chamber unit is positioned between said first and second vacuum transfer chamber units;

at least one vacuum process chamber unit connected to said first and second vacuum transfer chamber units such that said at least one vacuum process chamber unit is positioned between said first and second vacuum transfer chamber units;

a first robotic transfer mechanism located within said first vacuum transfer chamber unit to transfer some of said substrates between said at least one load lock chamber unit and said at least one vacuum process chamber unit through said first vacuum transfer chamber unit; and a second robotic transfer mechanism located within said second vacuum transfer chamber unit to transfer some of said substrates between said at least one load lock chamber unit and said at least one vacuum process chamber unit through said second vacuum transfer chamber unit;

at least one additional vacuum process chamber unit connected to said second vacuum transfer chamber unit such that said second vacuum chamber unit is positioned between said at least one vacuum process chamber unit and said at least one additional vacuum process chamber unit;

a third vacuum transfer chamber unit connected to said at least one additional vacuum process chamber unit such that said at least one additional vacuum process chamber unit is positioned between said second vacuum transfer chamber unit and said third vacuum transfer chamber unit;

a third robotic transfer mechanism located within said third vacuum transfer chamber unit to access said at least one additional vacuum process chamber unit;

a fourth vacuum transfer chamber unit connected to said at least one load lock chamber unit;

at least one additional load lock chamber unit connected to said fourth vacuum transfer chamber unit such that said fourth vacuum transfer chamber unit is positioned between said at least one load lock chamber unit and said at least one additional load lock chamber unit and a fourth linear robotic transfer mechanism located within said fourth vacuum transfer chamber unit to transfer some of said substrates between said at least one load lock chamber unit and said at least one additional load lock unit through said fourth transfer chamber unit.

10. The apparatus of claim 9 wherein said at least one load lock chamber unit includes two load lock chamber units, each of said two load lock chamber units being connected to said first and second vacuum transfer units.

11. The apparatus of claim 9 wherein each of said first and second robotic transfer mechanisms are linear robotic transfer mechanisms on at least one linear guide for linear motion.

* * * * *